United States Patent
Kobayashi et al.

(10) Patent No.: US 7,057,985 B1
(45) Date of Patent: Jun. 6, 2006

(54) RECORDING/REPRODUCING APPARATUS AND RECORDING/REPRODUCING METHOD

(75) Inventors: Shoei Kobayashi, Kanagawa (JP); Tadaaki Nomoto, Tokyo (JP)

(73) Assignee: Sony Corporation, Tokyo (JP)

( * ) Notice: Subject to any disclaimer, the term of this patent is extended or adjusted under 35 U.S.C. 154(b) by 456 days.

(21) Appl. No.: 09/689,005

(22) Filed: Oct. 12, 2000

(30) Foreign Application Priority Data

Oct. 20, 1999 (JP) .............................. P11-298301

(51) Int. Cl.
*G11B 11/00* (2006.01)
*H04N 5/06* (2006.01)

(52) U.S. Cl. .............................. 369/47.28; 369/47.48; 369/53.34; 369/59.11

(58) Field of Classification Search .............. 369/47.5, 369/44.13, 53.34, 47.55, 44.32, 53.18, 275.3, 369/275.4, 47.54, 47.23, 53.22, 44.26, 47.28, 369/47.48, 59.11
See application file for complete search history.

(56) References Cited

U.S. PATENT DOCUMENTS

| | | | | |
|---|---|---|---|---|
| 5,682,365 A * | 10/1997 | Carasso et al. | ............ | 369/47.5 |
| 6,069,870 A * | 5/2000 | Maeda et al. | ............ | 369/275.4 |
| 6,172,952 B1 * | 1/2001 | Inokuchi et al. | ......... | 369/47.55 |
| 6,219,318 B1 * | 4/2001 | Andoh | .................... | 369/47.28 |
| 6,333,902 B1 * | 12/2001 | Shim | ....................... | 369/47.54 |

* cited by examiner

*Primary Examiner*—William Korzuch
*Assistant Examiner*—Kim-Kwok Chu
(74) *Attorney, Agent, or Firm*—Oblon, Spivak, McClelland, Maier & Neustadt, P.C.

(57) ABSTRACT

A recording/reproducing apparatus and method are provided to record and reproduce data on and from a disk-shaped recording medium that has an address data area with embossed pits and a recording/reproducing area with a wobbling spiral groove. A wobble-signal processing circuit is used to extract a wobble signal from the signal the head obtains from the wobbling spiral groove and to provide the wobble signal to a PLL circuit to produce a sync signal therefrom. A pulse is produced at least during a wobble signal disturbance period occurring when switching between at least one of a recording and reproducing operation and provided to the PLL circuit in order to provide an unchanging sync signal during the wobble signal disturbance period to avoid the wobble disturbances from being carried over to the sync signal.

6 Claims, 9 Drawing Sheets

RECORDING/REPRODUCING APPARATUS AND RECORDING/REPRODUCING METHOD

BACKGROUND OF THE INVENTION

The present invention relates to a recording/reproducing apparatus and a recording/reproducing method, both designed to record and reproduce data on and from a disk-shaped recording medium that has an address data area having embossed pits and a recording/reproducing area having a wobbling spiral groove.

There is known a method of recording address data on an optical disk, in which pits are made in the process of forming the disk, thereby recording the address data. For example, the recording surface of the disk is divided into blocks called "sectors," each for storing 2048 (2 k) bytes of user data. Header data is recorded, in the form of pits, in the header area of each sector and is used as sector address. A recording/reproducing apparatus first reads the sector address. If the sector address pertains to a desired sector, the apparatus either records data on or reproduces data from the recording/reproducing area that follows the header area.

An optical disk is known, which has a spiral groove made in its surface and wobbling at a specific frequency. A recording/reproducing apparatus reads a wobble signal from the optical disk and reproduces synchronization data from the wobble signal. The amount of the synchronization data is measured in the recording/reproducing apparatus, thereby interpolating the address position, even if the disk has defects, destroying the address data. The apparatus can therefore achieve continuous data-recording. In addition, the frequency of the wobble signal can be used to control the rotation speed of the spindle motor incorporated in the recording/reproducing apparatus.

As described above, the recording/reproducing apparatus generates the synchronization data from the wobble signal and uses the frequency of the wobble signal to control the rotation speed of the spindle motor. The wobble signal must therefore be detected with high precision. It is difficult, however, to detect the wobble signal when a complex operation is performed as the operating mode is switched from the recording mode to the reproducing mode.

The wobble signal may become discontinuous or distorted when a track jump occurs, when the operating mode is switched from the reproducing mode to the recording mode, or when the head crosses the address data area. If this happens, the high-precision synchronization data cannot be generated from the wobble signal.

BRIEF SUMMARY OF THE INVENTION

The present invention has been made in view of the foregoing. The object of the present invention is to provide a recording/reproducing apparatus and a recording/reproducing method, both capable of remove any signal generated when the wobble signal is either discontinuous or distorted, while the data is being recorded on or reproduced from a disk-shaped recording medium.

To achieve this object, a recording/reproducing apparatus according to the invention is designed to record and reproduce data on and from a disk-shaped recording medium that has an address data area having embossed pits and a recording/reproducing area having a wobbling spiral groove. The apparatus comprises: head means for reading address data from the address data area and writing and reading a signal in and from the recording/reproducing area; and wobble-signal processing means for extracting a wobble signal from the signal the head means has read from the recording/reproducing area, and for holding an output from a PLL circuit designed to reproduce a sync signal from the wobble signal at least for a wobble signal disturbance period when switching between recording and reproducing modes.

To attain the object mentioned above, a recording/reproducing method according to this invention is designed to record and reproduce data on and from a disk-shaped recording medium that has an address data area having embossed pits and a recording/reproducing area having a wobbling spiral groove. The method comprises the steps of: extracting a wobble signal from a signal read from the recording/reproducing area; and holding an output from a PLL circuit providing a sync signal from the wobble signal at least during a disturbance of the wobble signal occurring for a period of time when switching between recording and reproducing modes.

With the present invention it is possible to remove any signal generated when the wobble signal is either discontinuous or distorted, thereby obtaining a synchronization signal of high precision.

DETAILED DESCRIPTION OF THE INVENTION

An embodiment of the present invention will be described, with reference to the accompanying drawings.

The embodiment is an optical disk apparatus for recording and reproducing data on and from an optical disk that has an address data area having embossed pits and a recording/reproducing area having a wobbling spiral groove.

Figure 1:
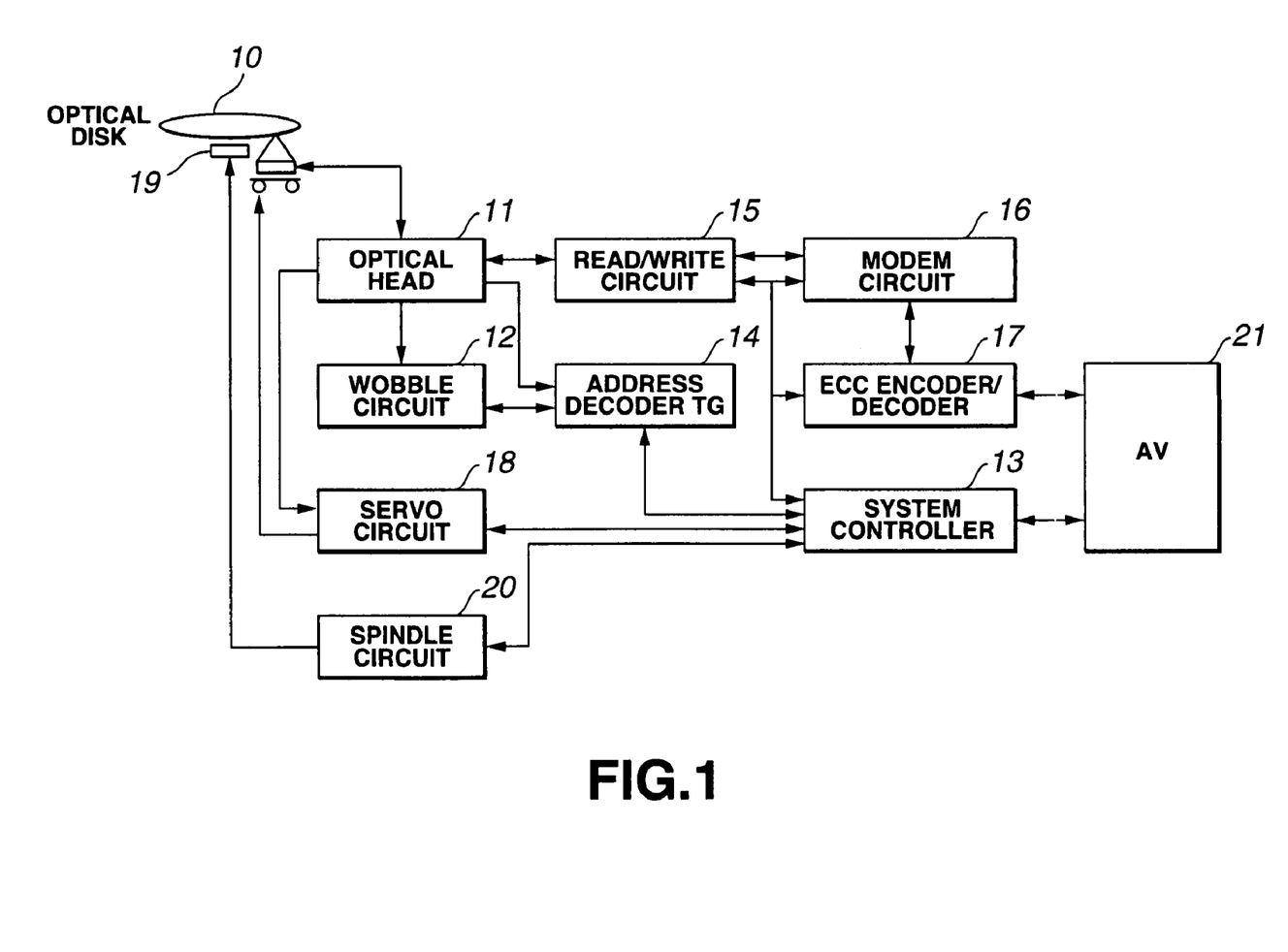
FIG. 1 is a block diagram illustrating an apparatus for recording and reproducing data on and from an optical disk, which is an embodiment of the present invention.

FIG. 1 shows the optical disk apparatus. The optical disk apparatus comprises an optical head (OP head) 11, a wobble circuit 12, a system controller (syscon) 13, and an address-decoding timing generator (Address DEC TG) 14. The OP head 11 applies a laser beam to an optical disk 10 to read and write data on and from the optical disk 10. The wobble circuit 12 obtains a wobble signal from the read signal supplied from the OP head 11 and generates a sync signal. The address-decoding timing generator (Address DEC TG) 14 receives a reproduced signal from the optical head 11 and decodes the address of the reproduced signal, thereby generating address data. The address data is supplied to the system controller 13. The generator 14 receives the sync signal from the wobble circuit 12 and generates a timing signal from the sync signal. The sync signal is supplied to some other components via the system controller 13.

The optical disk apparatus further comprises a read/write (RW) circuit 15, a modem circuit 16, an ECC encoder/decoder 17, a servo circuit 18, a spindle motor 19, and a spindle circuit 20. The read/write (RW) circuit 15 performs recording compensation to record data on the disk 10 and reproduce binary data by means of a phase-locked loop (PLL) and the like to reproduce data from the disk 10. The modem circuit 16 modulates the data to be recorded on the optical disk 10 and demodulates data reproduced from the optical disk 10. The ECC encoder/decoder 17 encodes (ENC) and decodes (DEC) an error correcting code (ECC). The servo circuit 18 performs the seek operation of the OP head 11 and effects servo control on the two-axis actuator incorporated in the OP head 11. The spindle circuit 20 controls the spindle motor 19. Note that the system controller 13 controls any other component, either directly or indirectly.

The OP head 11 is composed of an optical system, a reproduction IV amplifier, a two-axis actuator and the like. The optical system includes a laser diode LD.

The optical disk 10 on and from which the optical disk apparatus reads and writes data will be described, with reference to FIGS. 2 and 3.

Figure 2:
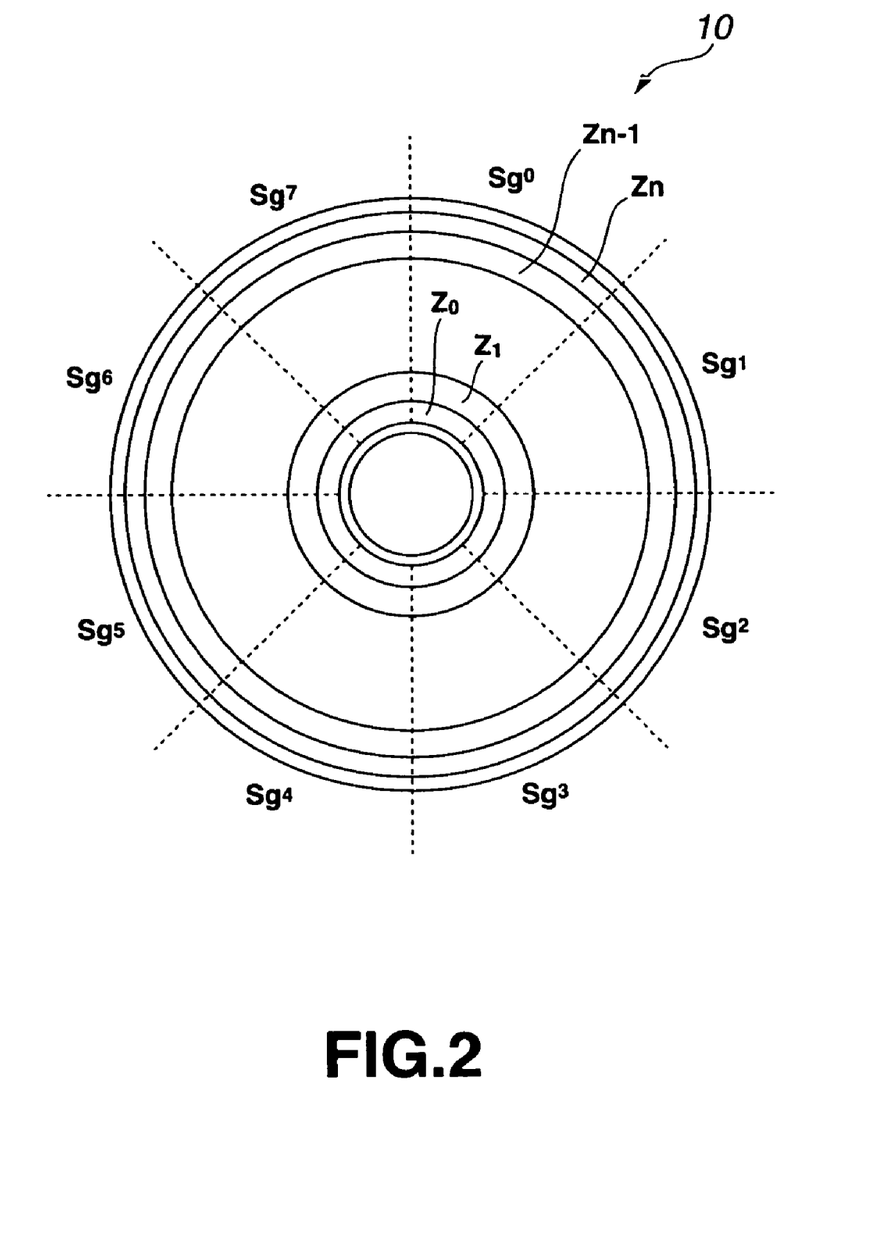
FIG. 2 is a diagram illustrating an optical disk on and from which the recording/reproducing apparatus records and reproduces data.
Figure 3:
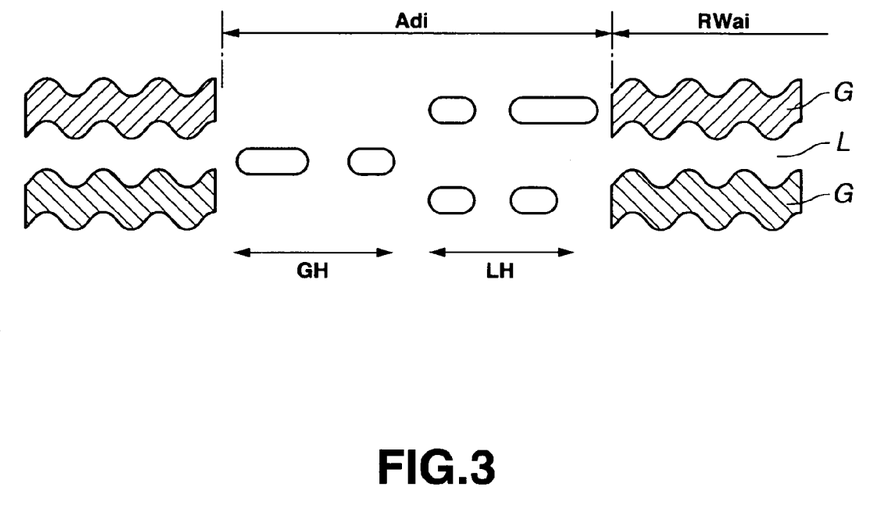
FIG. 3 is a diagram depicting the address data area and recording/reproducing area of the optical disk.

As FIG. 2 shows, the optical disk 10 has a number of concentric tracks. Each track consists of eight segments $Sg_0$ to $Sg_7$. As shown in FIG. 3, each segment $Sg_i$ is composed of an address area $Ad_{ai}$ and a read/write area $RW_{ai}$. The address area $Ad_{ai}$ has embossed pits. The read/write area $RW_{ai}$ has spiral grooves G and a spiral land L. The spiral grooves G and the spiral land L are wobbling at a predetermined frequency. The wobbling is used as synchronization data.

As shown in FIG. 2, the read/write area $RW_{ai}$ are grouped, forming n+1 zones $Z_0$ to $Z_n$ arranged from the innermost track to the outermost rack. In the innermost zone $Z_0$, each segment $Sg_i$ has 420 wobble waves. Hence, 3360 wobble waves exist in the innermost track. The grooves G in the innermost zone $Z_0$ are, of course, wobbling. In the second innermost zone $Z_i$, each segment $Sg_i$ has 426 wobble waves, six more waves than in the innermost zone $Z_0$. Thus, 3408 wobble waves exist in the second innermost track. Similarly, each segment of any zone has six more waves than each zone of the immediately inner zone, and each zone has 48 more waves than the immediately outer zone. The wobble frequency at the innermost part of each zone $Z_i$ is the same as that at the innermost part of any other zone. In the outermost zone $Z_n$, each segment $Sg_i$ has 420+6n wobble waves, and 3360+48n wobble waves exist in the outermost track.

In each zone $Z_i$, the address areas $Ad_n$ are arranged in the CAV fashion, that is, m the radial direction of the optical disk 10. In each address area Ada, the address data of the grooves G is written as groove header GH, and the address data of the land L is written as land header LH. The address areas Ada are formed at the same density in the innermost part of each zone $Z_i$.

How the optical disk apparatus records and reproduces data on and from the optical disk 10 will be now described. To record data on the disk 10, an AV system 21 supplies a record command and an MPEG2 image bit stream to the optical disk apparatus. In the optical disk apparatus, the system controller 13 receives the record command. The system controller 13 acquires the address data from the address DEC TG 14 and controls the servo circuit 18, which performs a seek operation of the OP head 11. More precisely, the servo circuit 18 moves the head 11 to a desired address position on the optical disk 10. Meanwhile, the ECC circuit 17 effects ECC encoding on the bit stream to be recorded on the optical disk 10. The modem circuit 16 modulates the bit stream thus encoded. The RW circuit 15 performs recording compensation and dives the laser diode LD incorporated in the OP head 11, whereby the bit stream modulated is recorded on the optical disk 10 at the timing designated by the address DEC TG 14.

To reproduce the data from the optical disk 10, the AV system 21 supplies a reproduce command to the system controller 13. The system controller 13 receives address data from the address DEC TG 14 and controls the servo circuit 18, which carries out a seek operation of the OP head 11. The OP head 11 is thereby moved to a desired address position on the optical disk 11. The RW circuit 15 receives a signal reproduced from the OP head 11 and supplies the same to the modem circuit 16. The modem circuit 16 demodulates the signal, thereby reproducing the bit stream. The bit stream reproduced is supplied to the ECC 17. ECC 17 corrects errors in the bit stream and decodes the bit stream, reproducing the image bit stream. The image bit stream, thus reproduced, is supplied to the AV system 21.

In the course of recording data and reproducing data, the wobble circuit 12 detects a wobble signal from the signal supplied from the OP head 11. The wobble circuit 12 generates a sync signal from the wobble signal. The sync signal is supplied to the address DEC TG 14.

Figure 4:
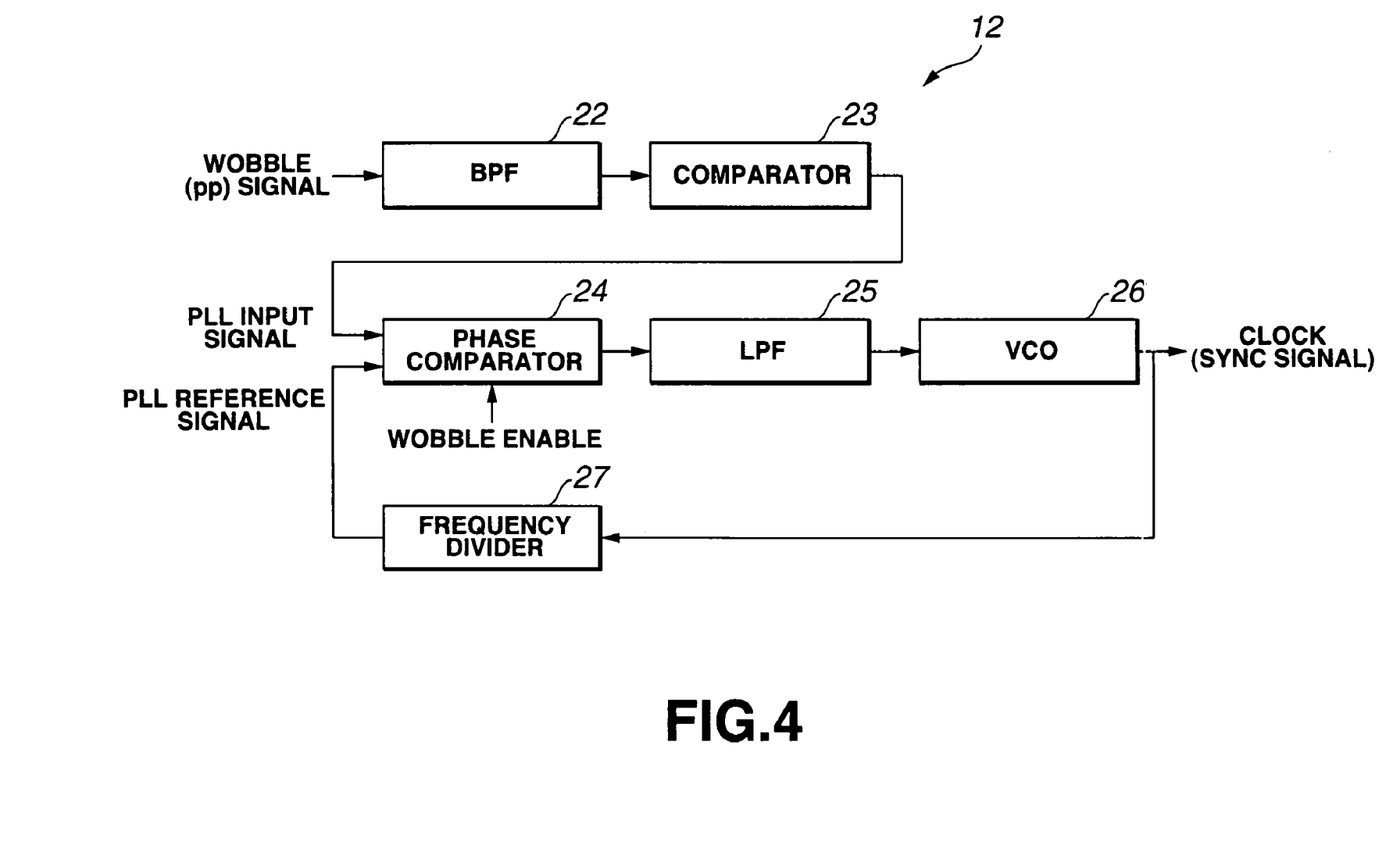
FIG. 4 is a block diagram showing the wobble circuit incorporated in the recording/reproducing apparatus.

When the wobble circuit 12 extracts the wobble signal from the signal read by the OP head 11 and generates the sync signal from the wobble signal, it holds the PLL circuit (not shown) that generates the sync signal for any part of the wobble signal that has not been normally extracted. FIG. 4 shows the wobble circuit 12 in detail.

As shown in FIG. 4, the wobble circuit 12 comprises a band-pass filter (BPF) 22, a comparator 23, a phase comparator 24, a low-pass filter (LPF) 25, a voltage-controlled oscillator (VCO) 26, and a frequency divider 27. The wobble signal is obtained from a so-called "push-pull (pp) signal." To be more specific, the push-pull signal is made to pass through the BPF 22. A wobble-frequency component, i.e., a wobble signal, is thus extracted from the push-pull signal. The comparator 23 converts the wobble signal to a binary signal. The binary signal is input, as a PLL signal, to the phase comparator 24. The phase comparator 24 compares the PLL signal with a PLL reference signal, generating a phase-difference signal, when a wobble enable signal is set at "H" (high level). While the wobble enable signal remains at "L" (low level), the output of the phase comparator 24 is held. The phase-difference signal is input via the LPF 25 to the VCO 26. The VCO 26 generates a clock signal, the frequency of which accords with the input voltage.

The frequency divider 27 divides the frequency of the clock signal, thus generating a PLL reference signal that has the same frequency as the wobble signal. A phase-locked loop (PLL) is thereby formed, which makes nil the phase difference between the PLL input signal and the PLL reference signal. The clock signal is supplied as a sync signal to the address-decoding timing generator 14. The generator 14 generates a timing signal from the sync signal.

Figure 5:
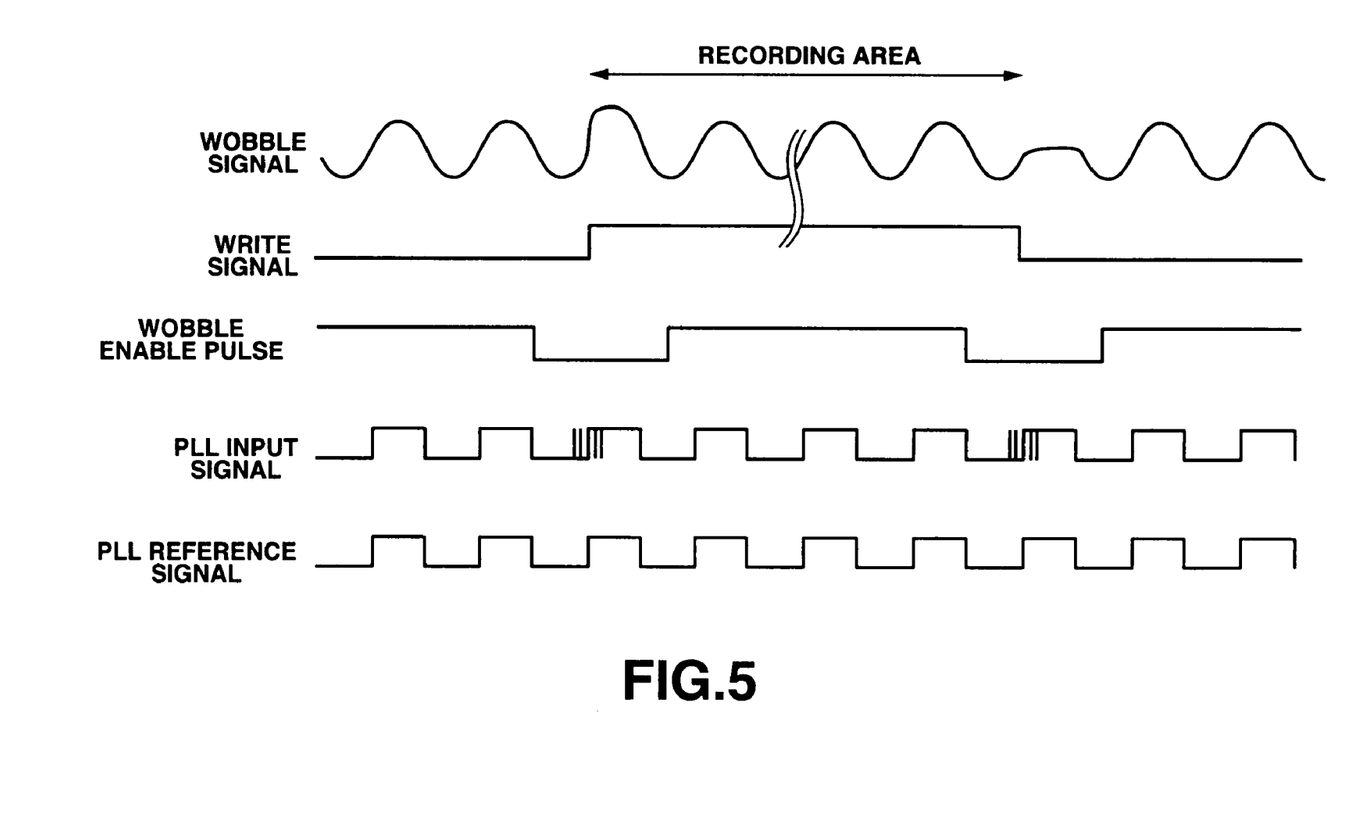
FIG. 5 is a timing chart illustrating how a wobble signal is generated during the data-recording and how a synchronization signal is generated from the wobble signal.

FIG. 5 illustrates how a wobble signal is generated during the data-recording and how a synchronization signal is generated from the wobble signal. In other words, FIG. 5 shows how the optical disk apparatus operates in the recording mode when the write signal is at "H". As shown in FIG. 5, the wobble signal has its waveform distorted when the operating mode changes from the reproducing mode to the recording mode, and vice versa. The waveform of the PLL input signal is distorted, too, as the operating mode is switched. The wobble enable signal is set at "L" when the operating mode changes from the reproducing mode to the recording mode, and vice versa, as is illustrated in FIG. 5. Note that the system controller 13 generates the wobble enable signal.

When the wobble signal is distorted in its waveform, the PLL is held. This prevents the waveform distortion of the wobble signal from influencing the recording of data.

How a wobble signal is generated during the track jump and how a synchronization signal is generated from the wobble signal will be described, with reference to FIG. 6.

Figure 6:
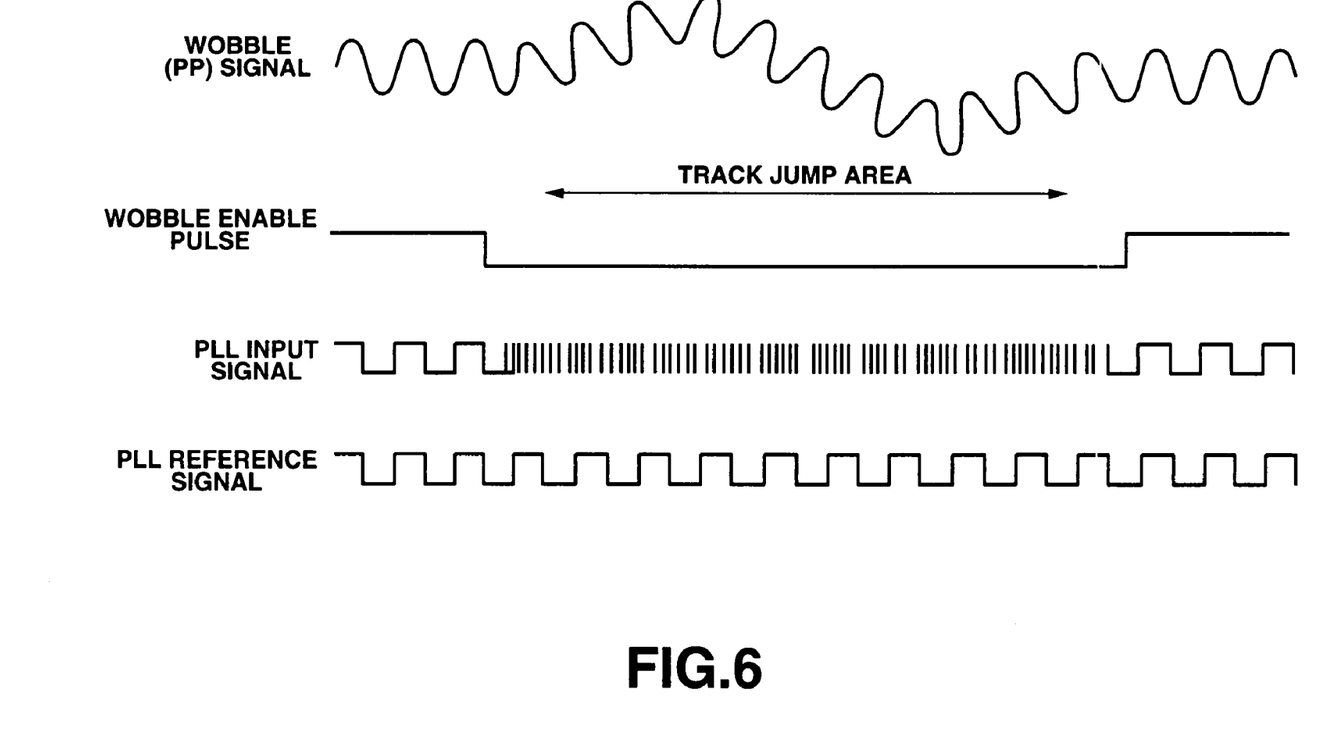
FIG. 6 is a timing chart explaining how a wobble signal is generated during the track jump and how a synchronization signal is generated from this wobble signal.

As shown in FIG. 6, the push-pull signal is affected by the track jump. The PLL input signal cannot form a binary waveform that wobbles adequately. To generate a sufficiently wobbling signal, the wobble enable signal is set at "L" in the track jump area, as is illustrated in FIG. 6. The PLL is thereby held, thereby preventing the track jump from affecting the push-pull signal.

Figure 7:
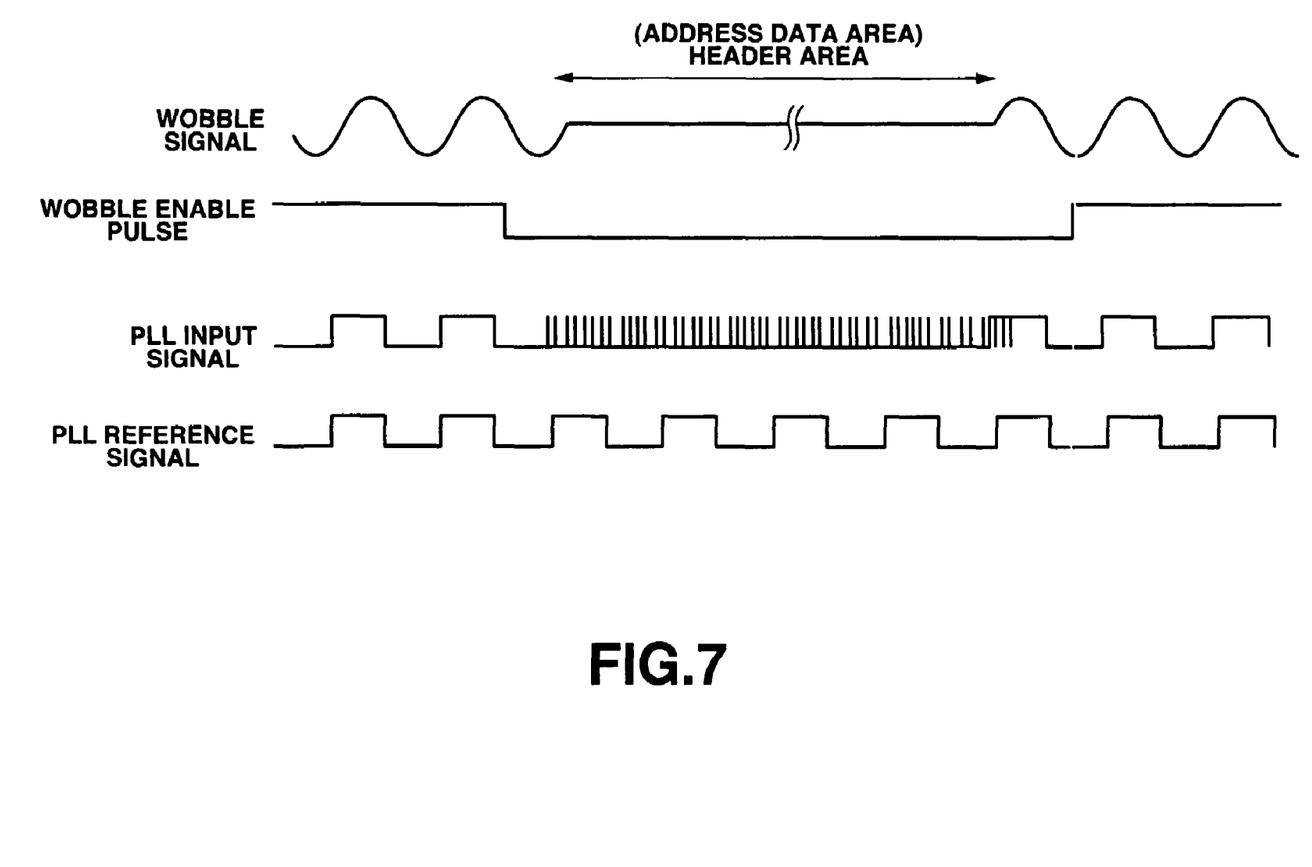
FIG. 7 is a timing chart showing how a wobble signal is generated from the address data area and how a synchronization signal is generated from the wobble signal.

FIG. 7 shows how a wobble signal is generated from the address data area and how a synchronization signal is generated from the wobble signal.

As shown in FIG. 7, there is no wobble signal in the address data area. The PLL input signal is inevitably influenced in the address data area. To prevent the PLL input signal from being influenced, the wobble enable signal is set at "L" in the address data area as is illustrated in FIG. 7. The PLL is thereby held, thus preventing the PLL input signal from being influenced in the address data area.

Figure 8:
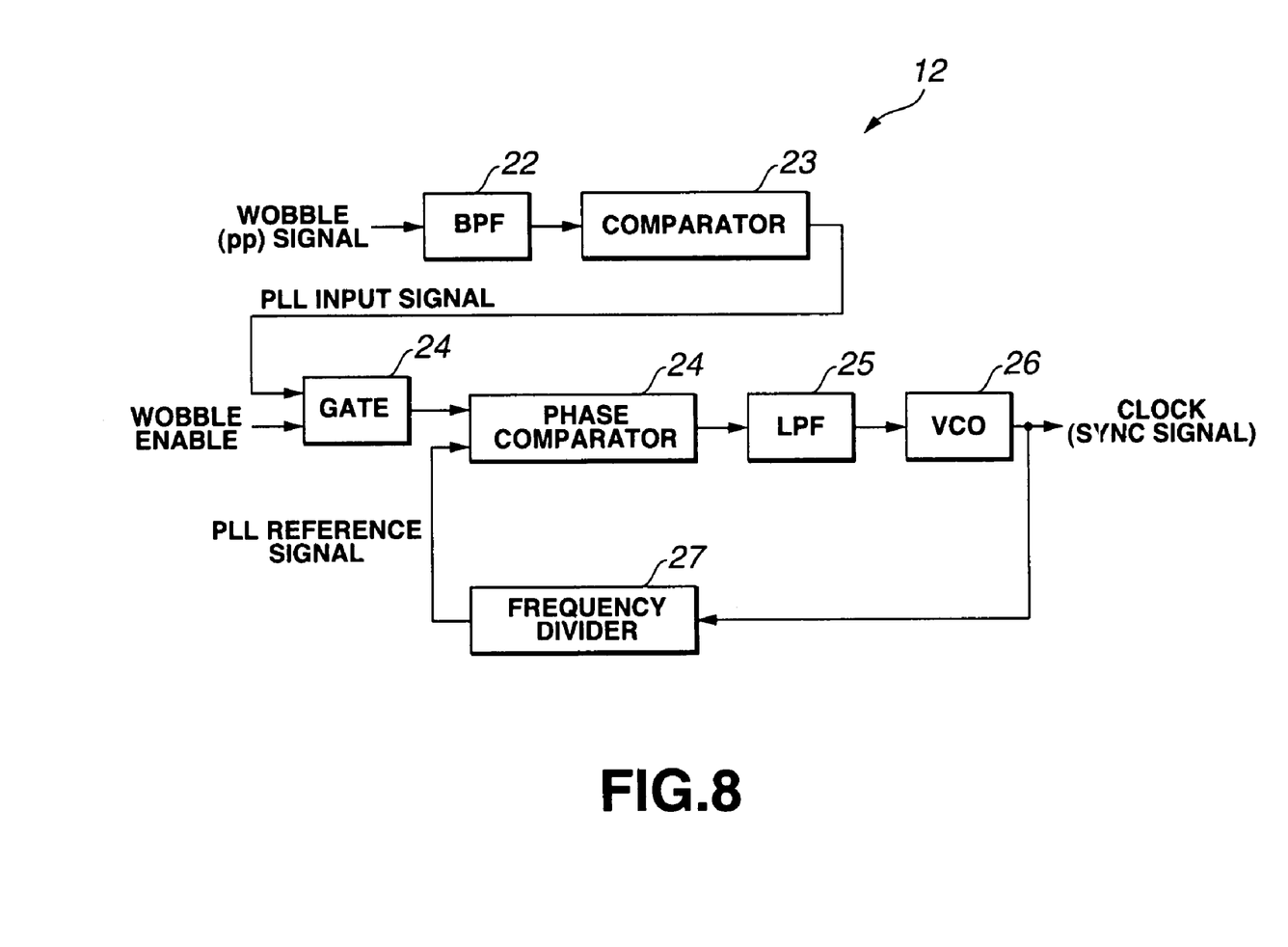
FIG. 8 is a block diagram illustrating another type of a wobble circuit that generates a synchronization signal from a wobble signal.

FIG. 8 shows another type of a wobble circuit 12, which generates a synchronization signal from a wobble signal.

The wobble signal is generated from the push-pull (pp) signal. More specifically, the push-pull signal is made to pass through the band-pass filter (BPF) 22. The BPF 22 extracts a wobble-frequency component from the push-pull signal, thus generating a wobble signal. The comparator 23 converts the wobble signal to a binary signal. The binary signal is input to the gate 28, to which a wobble enable signal is input, too. When the wobble enable signal is at "H", the gate 28 outputs the binary signal. The gate 28 does not output the binary signal when the wobble enable signal is at "L". The signal output from the gate 28 is the PLL input signal that is input to the phase comparator 29. The phase comparator 29 compares the PLL input signal with a PLL reference signal in terms of phase, generating a phase-difference signal. The phase-difference signal is input via the LPF 25 to the VCO 26. The VCO 26 generates a clock signal, the frequency of which accords with the input voltage.

The frequency divider 27 divides the frequency of the clock signal, thus generating a PLL reference signal that has the same frequency as the wobble signal. The phase comparator 29 is, for example, an exclusive OR (EOR) circuit, forming a phase-locked loop (PLL) that provides a phase difference of 90° between the PLL input signal and the PLL reference signal. Even if no PLL input signal is supplied to the phase comparator 29, the output of the comparator 29 passes through the LPF 25 and reduces to nil. The PLL is thereby held. The clock signal, i.e., the output of the VCO 26, is used as a sync signal to generate a timing signal.

Figure 9:
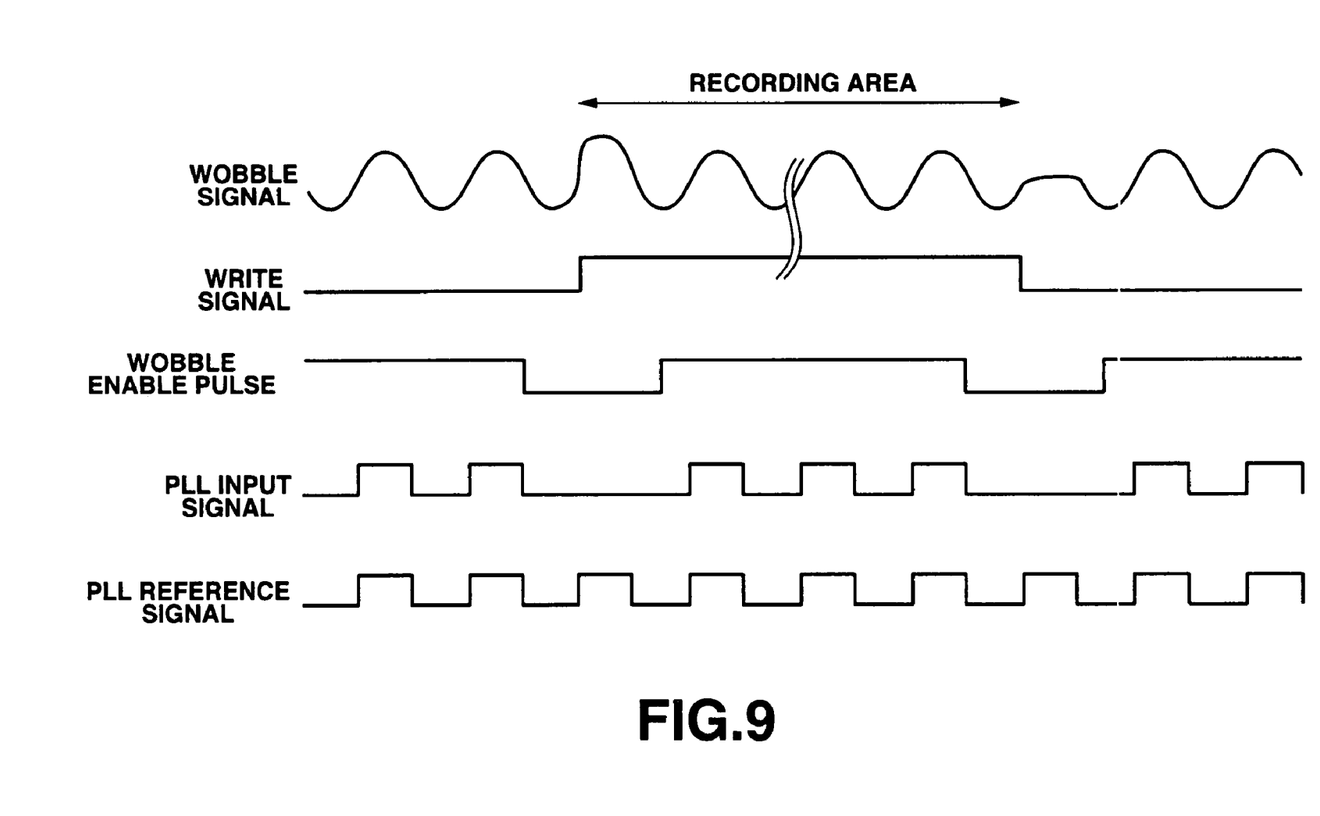
FIG. 9 is a timing chart explaining how the wobble circuit of FIG. 8 generates a wobble signal and how a synchronization signal is generated from the wobble signal generated by the wobble circuit.

FIG. 9 explains how the wobble circuit of FIG. 8 generates a wobble signal and how a synchronization signal is generated from the wobble signal.

More precisely, FIG. 9 illustrates the recording mode the apparatus takes when the write signal is at "H". As shown in FIG. 9, the wobble signal is distorted in waveform when the operating mode is switched from the reproducing mode to the recording mode. The wobble enable signal is therefore set at low level when the mode is switched from the reproducing mode to the recording mode and when the mode is switched from the recording mode to the reproducing mode. As shown in FIG. 9, the PLL input signal is at low level, while the wobble enable signal remains at "L", thus holding the PLL. This prevents the PLL input signal from being influenced by the waveform distortion of the wobble signal, which occurs in the recording mode.

What is claimed is:

1. A recording/reproducing apparatus for recording and reproducing data on and from an optical disk that has an address data area having embossed pits and a recording/reproducing area having a wobbling spiral groove, said apparatus comprising:

head means for reading address data from the address data area and writing and reading a signal in and from the recording/reproducing area;

system controller means for controlling components of the recording/reproducing apparatus including servo circuit means, the system controller means controlling the servo circuit means for moving the head means to a desired address position on the optical disk; and wobble-signal processing means for extracting a wobble signal from the signal the head means obtains from the wobbling spiral groove and for providing the wobble signal to a PLL circuit means for producing a sync signal from the wobble signal, wherein the system controller means further produces a wobble enable signal when the system controller means controls switching of the recording/reproducing apparatus between at least one of recording and reproducing operations, when the system controller means controls the servo circuit means to move the head means to a desired address position on the optical disc, and when the wobble-signal processing means otherwise does not provide a wobble signal extracted from the signal the head means obtains from the wobbling spiral groove and provides the wobble enable signal to the PLL circuit means, said PLL circuit means further providing an unchanging sync signal in response to receiving the wobble enable signal.

2. A recording/reproducing method of recording and reproducing data on and from an optical disk that has an address data area having embossed pits and a recording/reproducing area having a wobbling spiral groove, said method comprising the steps of:

reading address data from the address data area and writing and reading a signal from the recording/reproducing area using a head;

extracting a wobble signal from a signal obtained from the wobbling spiral groove when the head and wobbling spiral groove are in proximity;

providing the wobble signal to a PLL circuit to produce a sync signal from the wobble signal;

using a system controller to control components of a recording/reproducing apparatus to provide operations resulting in the loss of the extracted wobble signal including the operation of switching between recording and reproducing functions and operations in which the head is not in proximity with the wobbling spiral groove;

providing a wobble enable signal from the system controller to the PLL circuit at least when the system controller is controlling components of the recording/reproducing apparatus to provide the operations resulting in the loss of the extracted wobble signal the wobble enable signal from the system controller causing the PLL circuit to hold the sync signal unchanged as long as the wobble enable signal is provided by the system controller.

3. The recording/reproducing apparatus according to claim 1, wherein the system controller means provides the wobble enable signal to an input gate of the PLL circuit means also receiving the wobble signal from the wobble-signal processing means.

4. The recording/reproducing method according to claim 2, wherein the wobble enable signal from the system controller and the wobble signal are provided to respective inputs of a gate input of the PLL circuit.

5. A recording/reproducing apparatus configured to record and reproduce data on and from an optical disk that has an address data area having embossed pits and a recording/reproducing area having a wobbling spiral groove, said apparatus comprising:

a head configured to read address data from the address data area and to write and read a signal in and from the recording/reproducing area;

a system controller configured to control components of the recording/reproducing apparatus including a servo circuit, the system controller being further configured to control the servo circuit to move the head to a desired address position on the optical disk; and a wobble-signal processing circuit configured to extract a wobble signal from the signal the head obtains from the wobbling spiral groove and to provide the wobble signal to a PLL circuit configured to produce a sync signal from the wobble signal, and wherein the system controller is further configured to produce a wobble enable signal when the system controller controls switching of the recording/reproducing apparatus between at least one of a recording and a reproducing operation, when the system controller controls the servo circuit to move the head to a desired address position on the optical disc, and when the wobble-signal processing circuit otherwise does not provide a wobble signal extracted from the signal the head obtains from the wobbling spiral groove and provide the wobble enable signal to the PLL circuit, said PLL circuit being further configured to provide an unchanging sync signal in response to receiving the wobble enable signal from the system controller.

6. The recording/reproducing apparatus according to claim 5, wherein the system controller is connected to provide the wobble enable signal to an input gate of the PLL circuit also receiving the wobble signal from the wobble-signal processing circuit.

* * * * *